United States Patent
Dussauby et al.

(10) Patent No.: US 8,200,159 B2
(45) Date of Patent: Jun. 12, 2012

(54) RADIOELECTRIC TRANSMISSION AND RECEPTION MODULE MAINLY INTENDED FOR BROAD-BAND RADIO-COMMUNICATIONS

(75) Inventors: Marie-Pierre Dussauby, Saint Leu la Foret (FR); Vincent Jahier, St Leu la Foret (FR); Michel Giraudo, Rueil Malmaison (FR); Christophe Flouzat, Fontenay Aux Roses (FR)

(73) Assignee: Thales, Neuilly sur Seine (FR)

( * ) Notice: Subject to any disclaimer, the term of this patent is extended or adjusted under 35 U.S.C. 154(b) by 60 days.

(21) Appl. No.: 12/445,394

(22) PCT Filed: Oct. 10, 2007

(86) PCT No.: PCT/EP2007/060749
§ 371 (c)(1),
(2), (4) Date: Aug. 4, 2010

(87) PCT Pub. No.: WO2008/043776
PCT Pub. Date: Apr. 17, 2008

(65) Prior Publication Data
US 2010/0291875 A1    Nov. 18, 2010

(30) Foreign Application Priority Data
Oct. 13, 2006   (FR) ..................... 06 08996

(51) Int. Cl.
*H04B 15/00*   (2006.01)
*H04B 17/00*   (2006.01)
(52) U.S. Cl. ............... 455/62; 455/179.1; 455/180.1
(58) Field of Classification Search .............. 455/62, 455/131, 179.1, 180.1, 180.2, 190.1, 192.1, 455/300
See application file for complete search history.

(56) References Cited

U.S. PATENT DOCUMENTS
7,509,104 B2 *  3/2009  Song ................ 455/190.1
2006/0019623 A1  1/2006  Song FOREIGN PATENT DOCUMENTS
EP    0408066 A2   1/1991
JP    06125368 A   5/1994
JP    09074369 A   3/1997

OTHER PUBLICATIONS

Pneumatikakis, et al: A 900MHz/1800MHz/1900MHz superhet receiver engaging high IF1 for image rejection Devices, circuits and Systems, 2000. Proceedings of the 2000 third IEEE International Caracas Conference on Mar. 15-17, 2000, pp. 401-406.

* cited by examiner

*Primary Examiner* — Tuan H Nguyen
(74) *Attorney, Agent, or Firm* — Stroock & Stroock & Lavan LLP (57) ABSTRACT

The invention relates to a wireless transmitting and receiving module including a radiofrequency module filtering and amplifying the wireless signals received, a high intermediate frequency module transposing the wireless signals received to a high intermediate frequency, the transpositions being carried out by mixing of the wireless signals with signals of known frequency generated by local oscillator modules, and a low intermediate frequency module transposing the wireless signals received to a low intermediate frequency. In particular, the invention applies to the radiocommunication software modules that can receive and/or transmit on the broad band, that is to say in a frequency range from 30 MHz to 3 GHz.

9 Claims, 3 Drawing Sheets

RADIOELECTRIC TRANSMISSION AND RECEPTION MODULE MAINLY INTENDED FOR BROAD-BAND RADIO-COMMUNICATIONS

This is a U.S. National Phase Application under 35 U.S.C.§371 of International Application No. PCT/EP2007/060749, filed Oct. 10, 2007, and claims benefit of French Patent Application No. 0608996, filed Oct. 13, 2006, both of which are incorporated herein. The International Application was published in French on Apr. 17, 2008 as WO 2008/043776 under PCT Article 21 (2).

The invention relates to a wireless transmitting and receiving module. In particular, the invention applies to the radio-communication software modules that can receive and/or transmit on the broad band, that is to say in a frequency range from 30 MHz to 3 GHz (namely the frequency band normally designated by the acronym VHF for Very High Frequency and the frequency band normally designated by the acronym UHF for Ultra High Frequency).

Certain wireless transmitting and receiving modules can be software-programmed in order to be able to adapt to a range of signals extending over a broad range of frequencies (the extent of which covers several gigahertz). These modules called software modules may also be more generally adapted to many waveforms. The interest aroused by such modules, notably for the versatility that they offer, explains their use in a growing number of devices.

Consequently, these modules must be able to be adapted to many constraints. Amongst these constraints figure mainly the reduction in the costs of design and production, volume compactness and electricity consumption. There is also the achievement of the performance (for example the signal/noise ratio or else transmission rates, etc.) required as a function of each of the uses of said modules.

Such modules are today designed with the aid of specifically-developed electric components (more generally designated by the acronym ASIC for Application Specific Integrated Circuit) and consequently involve a high development cost. In addition, the current modules have a high electricity consumption, thereby limiting the fields of use.

In addition, in the radio modules that are very constricted in terms of performance, the radioelectrically polluting elements such as synthesizers (frequency generators such as transposition oscillators and the reference source) are insulated in the specific modules with independent mechanical cases. The various functions are therefore distributed over several interconnected boards, which significantly increases the cost of producing these radio modules.

Notably, the object of the invention is to remedy the aforementioned disadvantages. For this purpose, notably, the subject of the invention is a wireless transmitting and receiving module comprising at least the following elements:
  a radiofrequency module, said module comprising a first input and a first output of wireless signals forming a receiving channel, a second input and a second output of wireless signals forming a transmitting channel, the radiofrequency module filtering and amplifying the wireless signals received;
  a high intermediate frequency module, said module comprising a first input and a first output of wireless signals forming a receiving channel, a second input and a second output of wireless signals forming a transmitting channel, the wireless signals received being transposed to a high intermediate frequency, said high intermediate frequency being chosen to be at least greater than substantially twice the highest frequency of the wireless signals received by the radiofrequency module;
  a low intermediate frequency module, said module comprising a first input and a first output of wireless signals forming a receiving channel, a second input and a second output of wireless signals forming a transmitting channel, the wireless signals received being transposed to a low intermediate frequency.

The radiofrequency module, the high intermediate frequency module and the low intermediate frequency module are electrically and mechanically insulated and placed on one and the same board.

In one embodiment, the radiofrequency module receives, on the first input wireless signals on the 225-520 MHz frequency band, and on the other hand wireless signals on the 30-88 MHz frequency band, said module comprising a transmit channel and a receive channel for the 225-520 MHz frequency band and a transmit channel and a receive channel for the 30-88 MHz frequency band. The receive channel for the 225-520 MHz frequency band comprises a band-pass filter, a power limiter, an array of tracking filters comprising band-pass filters the central frequency of which varies according to a control voltage, a variable attenuator and a low-noise amplifier. The receive channel for the 30-88 MHz frequency band comprises a band-pass filter chopping the high and low frequencies outside said frequency band, a power limiter, a tracking filter comprising a band-pass filter the central frequency of which varies according to a control voltage, a variable attenuator and a low-noise amplifier. The transmit channel for the 225-520 MHz frequency band comprises an amplifier, an attenuator, a tunable and/or variable attenuator, the array of tracking filters comprising the band-pass filters, an amplifier, a switch and a low-pass filter cutting the high frequencies outside said frequency band. The array of tracking filters is shared with the receive channel for the 225-520 MHz frequency band. The switch routes the signals to be transmitted in the 225-520 MHz frequency band to the low-pass filter. The transmit channel for the 30-88 MHz frequency band comprises an amplifier, an attenuator, a tunable and/or variable attenuator, the tracking filter, the amplifier, the switch, a limiter and a band-pass filter cutting the low and high frequencies outside said frequency band. The tracking filter is shared with the receive channel for the 30-88 MHz frequency band. The switch routes the signals to be transmitted in the 30-88 MHz frequency band to the filter.

In one embodiment, the high intermediate frequency module receives on the first input wireless signals on the 225-520 MHz frequency band, and on the other hand wireless signals on the 30-88 MHz frequency band. The module comprises a transmit channel and a receive channel for the 225-520 MHz frequency band and a transmit channel and a receive channel for the 30-88 MHz frequency band. The module comprises a low-pass filter the chopping frequency of which is substantially equal to 600 MHz, a mixer, amplifiers, band-pass filters, a 70 MHz high-pass filter, amplifiers and a mixer. For the receive channel, the signal received on the first input is sent to the low-pass filter, the signal filtered by the low-pass filter being mixed by the mixer with the signal received on a third input connected to a first local oscillator module. The signal resulting from the mixer is filtered and amplified, then mixed by the mixer with the signal received on the fourth input. The signal is then routed to the second output. For the transmit channel, the signal received on the second input is mixed by the mixer with the signal originating from a fourth input connected to a second local oscillator module, filtered and amplified, then mixed by the mixer with the signal received on the third input, then filtered by the low-pass filter, the signal then being routed to the first output.

In one embodiment, the local oscillator module comprises a voltage-controlled oscillator designed to deliver a signal with a frequency ranging between 1250 and 1820 MHz. The module comprises a device of the phase-locked loop type and a low-pass filter. The module receives on an input a signal the frequency of which is substantially stable and substantially equal to 160 MHz. The signal is delivered by a voltage-controlled crystal oscillator comprised in a clock module. The signal received from the input drives the device of the phase-locked loop type which generates a signal passing through the filter and driving the frequency of the signal generated by the voltage-controlled oscillator, the latter signal being transmitted to the third input of the high intermediate frequency module and to the device of the phase-locked loop type for closed-loop control.

In one embodiment, the second local oscillator module comprises a voltage-controlled oscillator designed to deliver a signal with a frequency ranging between 1150 and 1290 MHz. The module comprises a device of the phase-locked loop type and a low-pass filter. The module receives on an input a signal the frequency of which is substantially stable and substantially equal to 160 MHz. The signal is delivered by a voltage-controlled crystal oscillator comprised in a clock module. The signal received from the input drives the device of the phase-locked loop type which generates a signal passing through the filter and driving the frequency of the signal generated by the voltage-controlled oscillator, the latter signal being transmitted to the fourth input of the high intermediate frequency module and to the device of the phase-locked loop type for closed-loop control. The frequency of the signal transmitted on the output of the second local oscillator module may be chosen to be lower than or higher than the high intermediate frequency, the speed of frequency change being carried out at the speed of the frequency hops of the signal transmitted and/or received by the wireless transmitting and receiving module.

In one embodiment, the low intermediate frequency module receives on the first input wireless signals on the high intermediate frequency band, and on the other hand wireless signals on the 30-88 MHz frequency band. The module comprises a low-pass filter the chopping frequency of which is substantially equal to 70 MHz, amplifiers, an array of tracking filters comprising band-pass filters, an anti-aliasing filter, variable attenuators, a limiter and a switch. For the receive channel, the signal received on the first input is sent to the low-pass filter, amplified, attenuated, filtered by the array of tracking filters, then amplified, attenuated, amplified, filtered by the anti-aliasing filter and limited. The signal is then routed to the second output. For the transmit channel, the signal received on the second input is sent to the low-pass filter, amplified, attenuated, and filtered by the array of tracking filters, then amplified. The signal is then routed to the switch which blocks or redirects the signal to the low-pass filter. The signal is then routed to the first output.

All the inactive elements of the wireless transmitting and receiving module may be switched off.

Notably, the advantage of the invention is that it makes it possible to have high-order interference mixes. The interference responses are much less numerous than for a frequency that is conventionally lower. The high intermediate frequency structure of the module makes it possible to gain at least 20 dB on the following performances Rejection of the intermediate frequency
Rejection of the image frequency
Rejection of the local oscillator frequencies
Interference responses in receive mode
Interference lines in transmit mode Others features of the invention will appear with the aid of the following description given so as to be nonlimiting and made with respect to the appended drawings which represent:

Figure 1:
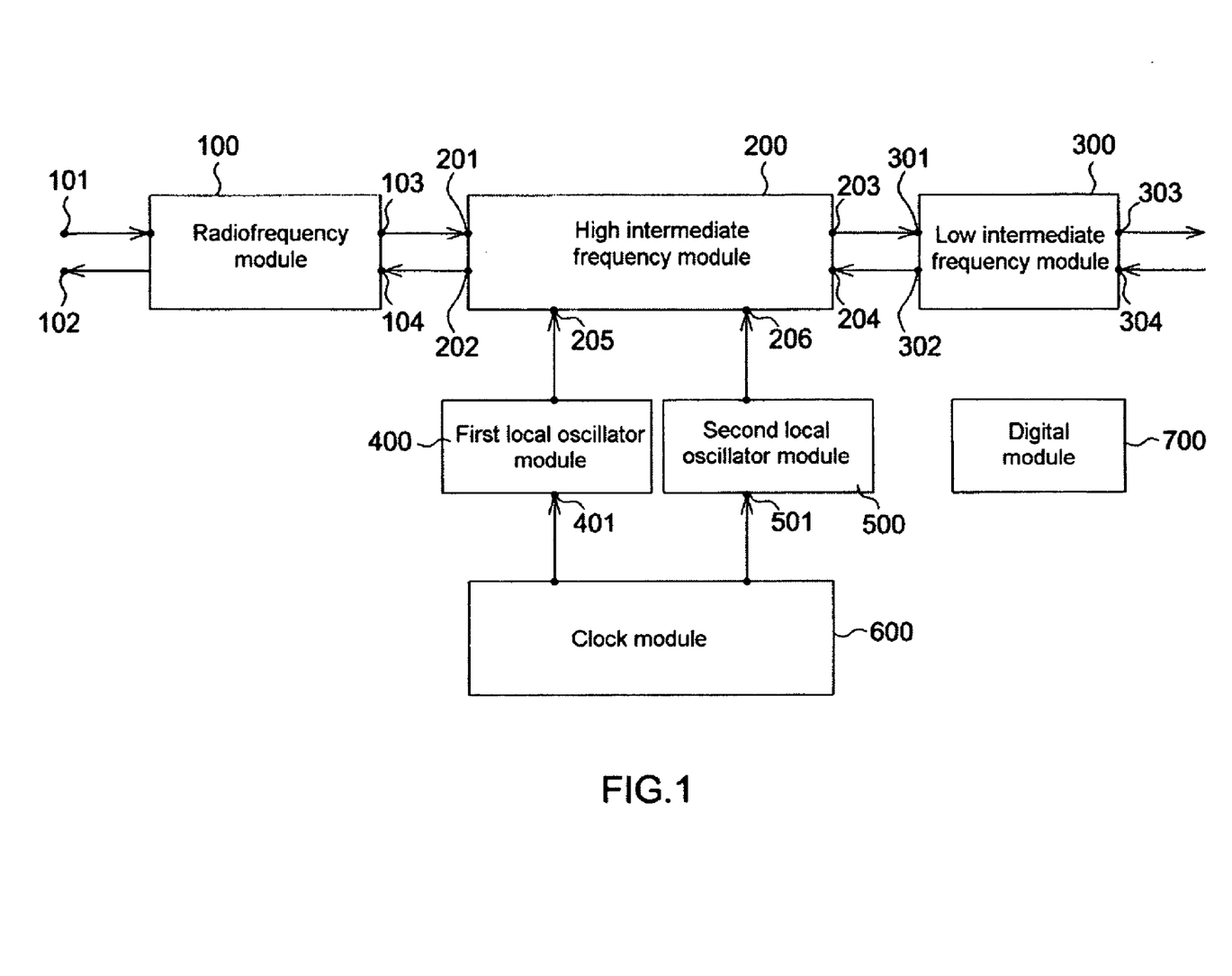
FIG. 1, a block diagram representing the modules included in the wireless transmitting and receiving module according to the invention.

FIG. 1 illustrates through a block diagram the modules included in the wireless transmitting and receiving module according to the invention. The wireless transmitting and receiving module comprises a radiofrequency module 100. The radiofrequency module 100 receives wireless signals on a first input 101. The wireless signals originate, for example, from an antenna designed to receive wireless signals comprised in a frequency band from 225 to 520 MHz (the UHF band) and from an antenna designed to receive wireless signals comprised in a frequency band from 30 to 88 MHz (the VHF band). The radiofrequency module 100 has, on a first output 103, the wireless signals received on the input 101 and optionally filtered and amplified. The radiofrequency module 100 receives wireless signals on a second input 104 and redirects them to one or more second outputs 102 after optionally having filtered and/or amplified them. The radiofrequency module 100 may be designed to process wireless signals on several frequency bands that are different and have multiple waveforms. For example, the radiofrequency module may process frequency-evasion waveforms spreading substantially from 30 to 600 MHz.

The wireless transmitting and receiving module comprises a high intermediate frequency module 200. The intermediate frequency module receives, on a first input 201, the wireless signals sent on the output 103 of the radiofrequency module. These wireless signals thus received are transposed to a high intermediate frequency. The value of the high intermediate frequency may be chosen to be greater than substantially twice the highest frequency of the wireless signals received by the radiofrequency module 100 on the input 101. The choice of such a high intermediate frequency makes it possible to have interference mixes of a high order. The interference responses are therefore much less numerous than for a frequency that is conventionally lower. For example, with a radiofrequency module processing frequency-evasion waveforms spreading substantially from 30 to 600 MHz, the high intermediate frequency may be chosen to be equal to 1.22 GHz. The wireless signals thus received, after having been transposed, are sent to a first output 203. Simultaneously, the high intermediate frequency receives, on a second input 204, wireless signals the frequency of which corresponds to a low intermediate frequency (for example of the order of 70 MHz). These signals are transposed to the high intermediate frequency, then sent to a second output 202. The output 202 is connected to the input 104 of the radiofrequency module 100. To carry out the frequency transpositions, the high intermediate frequency module 200 receives, on third and fourth inputs 205 and 206, signals of a substantially known frequency value, generated by "local oscillator" modules 400 and 500. Each local oscillator module 400 and 500 receives, on an input 401 and 501, one and the same reference signal produced by a clock module 600. The reference signal has a known frequency. For example, the frequency may be set at 160 MHz.

The wireless transmitting and receiving module comprises a low intermediate frequency module 300. The low frequency module receives, on a first input 301, the wireless signals sent on the output 203 of the high intermediate frequency module. These wireless signals thus received are transposed to a low intermediate frequency. For example, the low intermediate frequency may be substantially equal to 70 MHz. The wireless signals thus received, after having been transposed, are sent to a first output 303. The output 303 may be connected to a modem. In parallel, the low intermediate frequency module 300 receives, on a second input 304, wireless signals originating for example from a modem. These signals are transposed to the low intermediate frequency, then sent to a second output 302. The output 302 is connected to the input 204 of the high intermediate frequency module 200.

The wireless transmitting and receiving module also comprises a digital module 700. The digital module 700 controls the various buses (not shown) connecting the aforementioned modules comprised in the wireless transmitting and receiving module. The digital module may be a programmable-logic component, such as for example a component designated by the acronym FPGA for Field Programmable Gate Arrays.

The wireless transmitting and receiving module according to the invention comprises the aforementioned modules on a single board. Each module comprises for this purpose means ensuring that said module is electromagnetically sealed against the other modules. The means providing the electromagnetic seal are electric means (filtering means, for example) and mechanical means (shielding). Using the various modules on a single board makes it possible both to significantly reduce the costs of design and production and to enhance volume compactness and electricity consumption.

Figure 2:
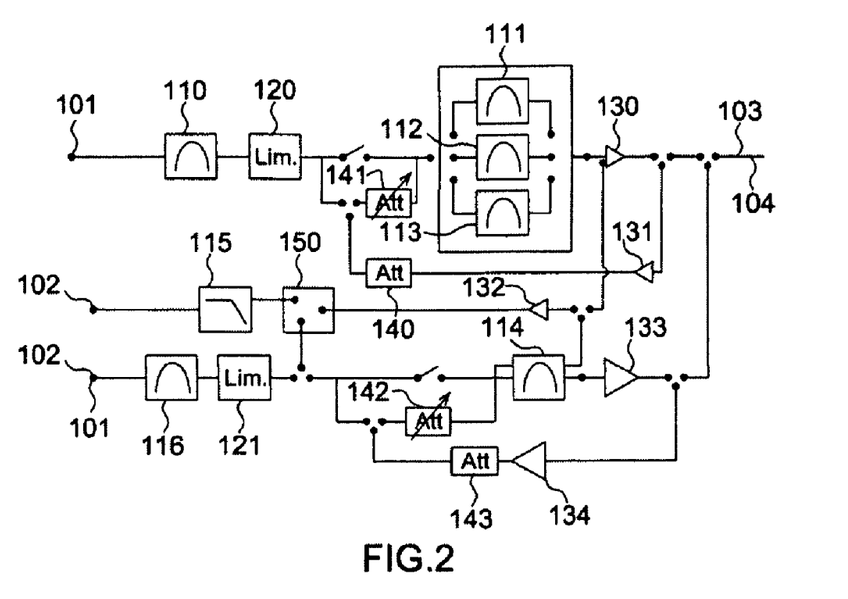
FIG. 2, a block diagram representing one embodiment of the radiofrequency module according to the invention.

FIG. 2 shows, through a block diagram, one embodiment of the radiofrequency module 100 according to the invention. The elements that are identical to the elements already shown in the other figures carry the same reference numbers. The input 101 receives on the one hand wireless signals on the 225-520 MHz (UHF) frequency band and on the other hand wireless signals on the 30-88 MHz (VHF) frequency band. The radiofrequency module 100 comprises a transmit channel (from the input 104 to the output 102) and a receive channel (from the input 101 to the output 103) for the UHF band and a transmit channel (from the input 104 to the output 102) and a receive channel (from the input 101 to the output 103) for the VHF band. Since the embodiment is represented in FIG. 2 in block-diagram form, the term "channel" should be understood as a functional group and not as a necessarily separate physical implementation. Therefore, physical components may clearly belong to several channels.

The receive UHF channel (from the input 101 to the output 103) comprises a band-pass filter 110, a power limiter 120, a variable attenuator 141, an array of tracking filters 111, 112, 113 and a low-noise amplifier 130. The band-pass filter 110 makes it possible to chop the high and low frequencies optionally comprised in the received signal and outside of the UHF band. The limiter 120 makes it possible to limit the received signal to a given power level. The variable attenuator 141 makes it possible to attenuate the high-power signals in order to prevent the receiving chain from being congested. The array of tracking filters the central frequency of which varies as a function of a control voltage, comprises a band-pass filter 111 (for example between 225 and 300 MHz), a filter 112 (for example between 300 and 400 MHz) and a band-pass filter 113 (for example between 400 and 520 MHz). The bandwidth of each of these filters is narrow, substantially equal to 8 MHz. The low-noise amplifier 130 makes it possible to amplify the filtered and limited signal by inserting a limited noise.

The receive VHF channel (from the input 101 to the output 103) comprises a band-pass filter 116, a power limiter 121, a variable attenuator 142, a tracking filter 114 and a low-noise amplifier 133. The band-pass filter 116 makes it possible to chop the high and low frequencies optionally comprised in the received signal and outside of the VHF band. The limiter 121 makes it possible to set a maximum power level for the received signal. The variable attenuator 142 makes it possible to attenuate the high-power signals in order to prevent the receiving chain from being congested. The tracking filter comprises a band-pass filter 114 the central frequency of which varies as a function of the control voltage (for example between 30 and 88 MHz). The bandwidth of this filter is narrow, substantially equal to 1 MHz.

The transmit UHF channel (from the input 104 to the output 102) comprises an amplifier 131, an attenuator 140, a tunable and/or variable attenuator 141, the array of tracking filters comprising the band-pass filters 111, 112, 113, an amplifier 132, a switch 150 and a low-pass filter 115. The low-pass filter 115 makes it possible to chop the high frequencies optionally comprised in the signal to be sent to the output 102 and outside of the UHF band. The attenuators 140 and 141 make it possible to reduce, according to a determined or variable law, the given power level of the signal to be transmitted. The array of tracking filters used is shared with the receive UHF channel. The function of the switch 150 is notably to route the signals to be transmitted in the UHF band to the filter 115 and, finally, to the appropriate output 102.

The transmit VHF channel (from the input 104 to the output 102) comprises an amplifier 134, an attenuator 143, a tunable and/or variable attenuator 142, the tracking filter 114, the amplifier 132, the switch 150, a limiter 121 and a band-pass filter 116. The band-pass filter 116 makes it possible to chop the low and high frequencies optionally comprised in the signal to be sent to the output 102 and outside of the VHF band. The attenuators 142 and 143 make it possible to reduce, according to a determined or variable law, the given power level of the signal to be transmitted. The tracking filter 114 used is shared with the receive VHF channel. The function of the switch 150 is notably to route the signals to be transmitted in the VHF band to the filter 116 and, finally, to the appropriate output 102.

Figure 3:
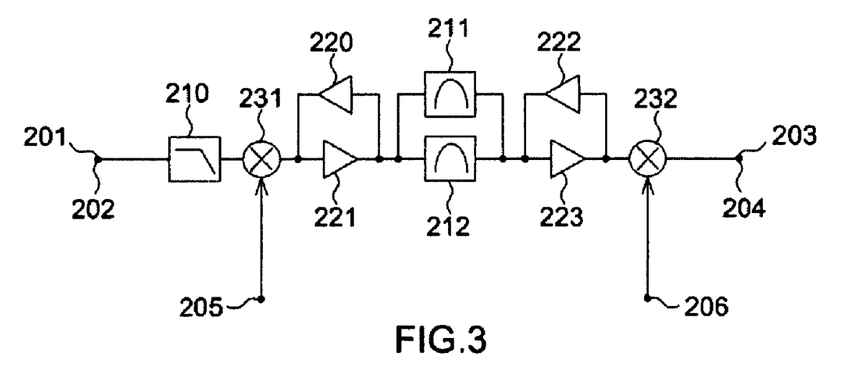
FIG. 3, a block diagram representing a high intermediate frequency module according to the invention.

FIG. 3 shows via a block diagram an embodiment of the high intermediate frequency module 200 according to the invention. The elements that are identical to the elements already presented in the other figures carry the same reference numbers. The intermediate frequency module 200 is bi-directional: its functions are used both in transmit and in receive mode (reversible chain) and are applied to the signals in the UHF and VHF band. The module 200 comprises a low-pass filter 210 the chopping frequency of which is substantially equal to 600 MHz, a mixer 231, amplifiers 220 and 221, band-pass filters 211 and 212, amplifiers 222 and 223, and a mixer 232. The mixer 231 must be substantially linear.

In receive mode, the signal received on the input 201 is sent to the low-pass filter 210. The signal filtered by the low-pass filter 210 is mixed by the mixer 231 with the signal received on the input 205 originating from the first local oscillator module 400. The signal resulting from the mixer 231 is then amplified 221 and filtered 212 or 211 and amplified 223, then mixed by the mixer 232 with the signal received on the input 206 originating from the second local oscillator module 500. The signal is then routed to the output 203.

In transmit mode, the signal received on the input 204 is mixed by the mixer 232 with the signal originating from the input 206, amplified 222, filtered 211 or 212 and amplified 220. The amplified and filtered signal is mixed by the mixer 231 with the signal received on the input 205, then filtered by the low-pass filter 210. The signal is then routed to the output 202.

The structure of the high intermediate frequency module 200 enhances the performance of intermediate frequency rejection, of image frequency rejection, of rejection of the frequencies delivered by the first and second local oscillator modules 400, 500 and rejection of the interference responses.

Figure 4:
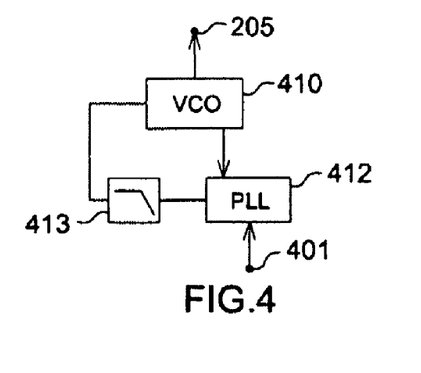
FIG. 4, a block diagram illustrating one embodiment of the local oscillator module according to the invention.

FIG. 4 shows, through a block diagram, an embodiment of the first local oscillator module 400 according to the invention. The elements identical to the elements already presented in the other figures carry the same reference numbers. The first local oscillator module 400 comprises a voltage-controlled oscillator 410 designed to deliver a signal with a frequency ranging between 1250 and 1820 MHz. The module 400 comprises a device of the phase-locked loop type 412 and a low-pass filter 413. The first local oscillator module 400 receives a signal on the input 401. The signal received on the input 401 is a signal the frequency of which is stable and substantially equal to 160 MHz, delivered by a voltage-controlled crystal oscillator comprised in the clock module 60. The signal received from the input 401 drives the device of the phase-locked loop type 412 which, in its turn, generates a signal passing through the filter 413 and driving the frequency of the signal generated by the voltage-controlled oscillator 410. This signal is transmitted to the output 205 and to the device of the phase-locked loop type 412 for closed-loop control. The device of the phase-locked loop type 412 is a device with low consumption and high spectral purity. The second local oscillator module 500 comprises elements identical to the first local oscillator module 400, differing however in the voltage-controlled oscillator designed to deliver a signal with a frequency ranging between 1150 and 1290 MHz. In addition, in order to optimize the number of blocked channels, the frequency of the signal transmitted on the output 206 is chosen to be less than or greater than the high intermediate frequency. The frequency of the signal transmitted on the output 206 of the second local oscillator module 500 may be chosen to be lower than or higher than the high intermediate frequency. The speed of frequency change is carried out at the speed of the frequency hops of the signal transmitted and/or received by the wireless transmitting and receiving module (the case of a frequency-evasion waveform for example). The first local oscillator module 400 and the second local oscillator module 500 are synchronized by the synchronization signal of the radio bus received by the digital module 700. The first local oscillator module 400 and second local oscillator module 500 have the same spectral purity as the local oscillators of the prior embodiments made at much lower frequencies, the prior art being at low intermediate frequency.

Figure 5:
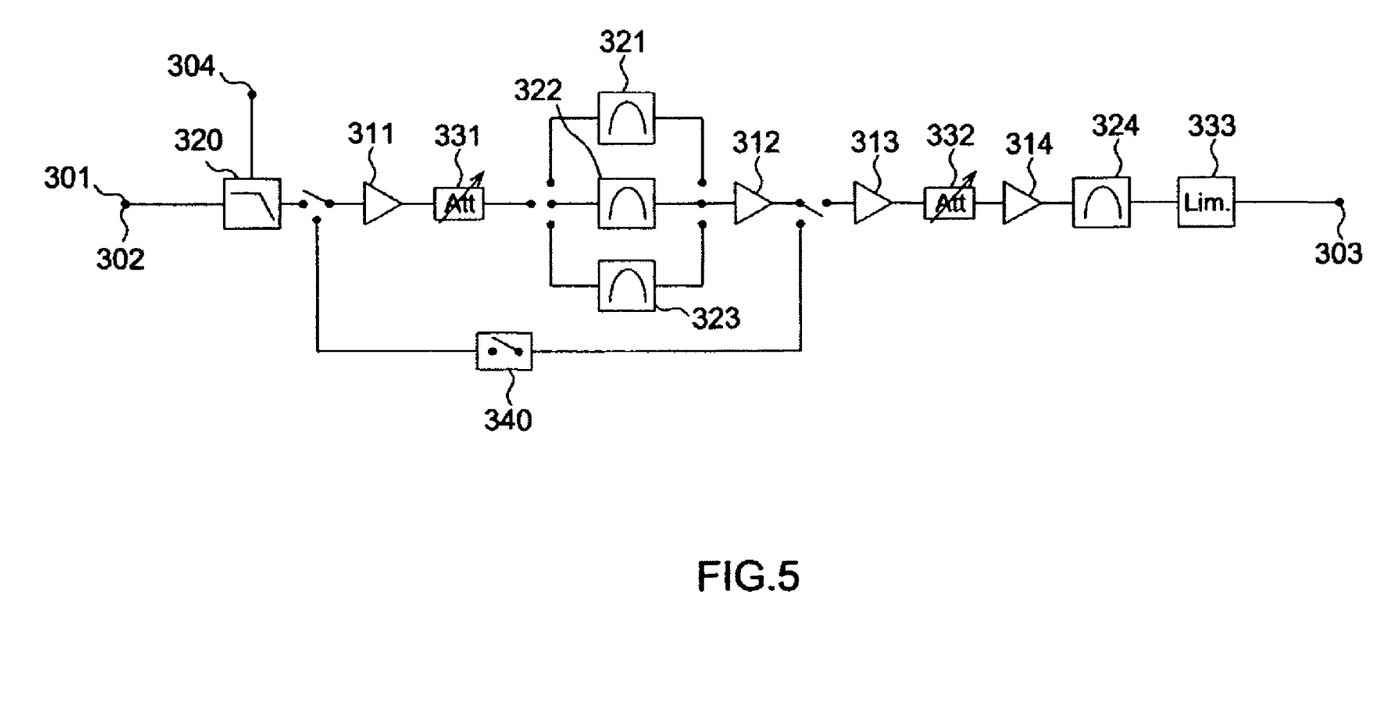
FIG. 5, a block diagram illustrating one embodiment of the low intermediate frequency module according to the invention.

FIG. 5 shows, through a block diagram, an embodiment of the low intermediate frequency module 300 according to the invention. The elements identical to the elements already presented on the other figures carry the same reference numbers. The low intermediate frequency module 300 is bi-directional: its functions are used both in transmit and in receive mode (reversible chain), and are applied to the signals in the UHF and VHF band. The module 300 comprises a low-pass filter 320 the chopping frequency of which is substantially equal to 70 MHz, amplifiers 311, 312, 313, 314, an array of tracking filters comprising band-pass filters 321 (with a bandwidth centered on 70 MHz, +/−30 kHz), 322 (with a bandwidth centered on 70 MHz +/−750 kHz), 323 (with a bandwidth centered on 70 MHz +/−2.5 MHz), an anti-aliasing filter 324, variable attenuators 331, 332, a limiter 333 and a switch 340.

In receive mode, the signal received on the input 301 is sent to the low-pass filter 320. The signal filtered by the low-pass filter 320 is amplified 311, attenuated 331, and filtered by the array of tracking filters, then amplified 312, 313, attenuated 332, amplified 314, filtered by the anti-aliasing filter 324 and limited 333. The signal is then routed to the output 303.

In transmit mode, the signal received on the input 304 is sent to the amplifier 311. The amplified signal 311 is attenuated 331, and filtered by the array of tracking filters, then amplified 312. The signal is routed to the switch 340 which blocks or redirects the signal to the low-pass filter 320. The signal is then routed to the output 302.

In one embodiment, all the inactive elements of the wireless transmitting and receiving module according to the invention for a given mode (that is to say for example transmit mode, receive mode, etc.) are switched off. Therefore, consumption of electricity is optimized.

The invention claimed is:

1. A wireless transmitting and receiving module, comprising:
   a radiofrequency module comprising:
      a receiving RF channel having a first input, a first output of RF wireless signals received, one or more filters, and one or more amplifiers;
      a transmitting RF channel having a second input and a second output of RF wireless signals transmitted; and
      wherein the radiofrequency module is configured to filter and to amplify the RF wireless signals received;
   the wireless transmitting and receiving module further comprising a high-IF module, said high-IF module comprising:
      a receiving high-IF channel having a first input of RF signals and a first output of high-IF signals; and
      a transmitting high-IF channel having a second input of high-IF signals and a second output of RF signals;
      wherein the RF signals received are transposed to a high intermediate frequency that is chosen to be at least greater than substantially twice the highest frequency of the RF wireless signals received by the radiofrequency module; and
   the wireless transmitting and receiving module further comprising a low-IF module, said low-IF module comprising:
      a receiving channel having a first input of high-IF signals and a first output of low-IF signals, wherein the high-IF signals are transposed to a low intermediate frequency; and
      a transmitting channel having a second input of low-IF signals and a second output of high-IF signals,
      wherein the radiofrequency module, the high-IF module and the low-IF module are electrically and mechanically insulated and placed on a shared circuit board;
      wherein the radiofrequency module receives, on the first input, one or more wireless signals in a 225-520 MHz frequency band, and one or more wireless signals in a 30-88 MHz frequency band, said radiofrequency module comprising a transmit channel and a receive channel for the 225-520 MHz frequency band and a transmit channel and a receive channel for the 30-88 MHz frequency band, wherein:
   the receive channel for the 225-520 MHz frequency band comprises:

a band-pass filter having an input that forms an input to the receive channel for the 225-520 MHz frequency band;

a power limiter having an input connected to an output of the band-pass filter;

an array of tracking filters having band-pass filters, each band-pass filter having an input that is selectably connected to an output of the power limiter, the central frequency of the array of tracking filters varying according to a control voltage;

a variable attenuator that is selectably connected between the output of the power limiter and the input of the array of tracking filters; and a low-noise amplifier having an input connected to the output of the array of tracking filters, and an output of the low-noise amplifier forming an output of the receive channel for the 225-520 MHz frequency band;

the receive channel for the 30-88 MHz frequency band comprising:

a band-pass filter having an input that forms an input to the receive channel for the 30-88 MHz frequency band, the band-pass filter attenuating frequencies outside said 30-88 MHz frequency band;

a power limiter having an input connected to an output of the band-pass filter of the receive channel for the 30-88 MHz frequency band;

a tracking filter comprising a band-pass filter having an input that is selectably connected to an output of the power limiter of the receive channel for the 30-88 MHz frequency band, the central frequency of the tracking filter varying according to a control voltage;

a variable attenuator that is selectably connected between the output of the power limiter of the receive channel for the 30-88 MHz frequency band and the input of the tracking filter of the receive channel for the 30-88 MHz frequency band; and a low-noise amplifier having an input connected to the output of the array of tracking filters, and an output of the low-noise amplifier forming an output of the receive channel for the 30-88 MHz frequency band;

the transmit channel for the 225-520 MHz frequency band comprising:

an amplifier having an input that forms an input to the transmit channel for the 225-520 MHz frequency band;

an attenuator having an input connected to an output of the amplifier of the transmit channel for the 225-520 MHz frequency band;

the array of tracking filters having band-pass filters, having an input connected to the output of the attenuator;

the variable attenuator, selectably connected between the output of the attenuator and the input of the array of tracking filters;

an amplifier having an input connected to the output of the array of tracking filters a switch having an input connected to an output of the amplifier; and a band-pass filter having an input connected to an output of the switch, and an output of the band-pass filter forming an output of the 225-520 MHz frequency band, the band-pass filter attenuating the high frequencies outside said frequency band, wherein the array of tracking filters is shared with the receive channel for the 225-520 MHz frequency band, the switch routing the signals to be transmitted in the 225-520 MHz frequency band to the band-pass filter;

the transmit channel for the 30-88 MHz frequency band comprising:

an amplifier having an input that forms an input to the transmit channel for the 30-88 MHz frequency band;

an attenuator having an input connected to an output of the amplifier of the transmit channel for the 30-88 MHz frequency band;

a tracking filter having an input connected to the output of the attenuator of the transmit channel for the 30-88 MHz frequency band;

the variable attenuator, selectably connected between the output of the attenuator of the transmit channel for the 30-88 MHz frequency band and the input of the tracking filter of the transmit channel for the 30-88 MHz frequency band;

an amplifier having an input connected to an output of the tracking filter of the transmit channel for the 30-88 MHz frequency band;

a limiter having an input connected to an output of the amplifier of the transmit channel for the 30-88 MHz frequency band; and a band-pass filter to attenuate frequencies outside said 30-88 MHz frequency band, wherein the tracking filter of the transmit channel for the 30-88 MHz frequency band and the switch are shared with the receive channel for the 30-88 MHz frequency band.

2. The wireless transmitting and receiving module as claimed in claim 1, wherein all inactive elements of the wireless transmitting and receiving module are capable of being selectively switched off.

3. A wireless transmitting and receiving module, comprising:

a radiofrequency module comprising:

a receiving RF channel having a first input, a first output of RF wireless signals received, one or more filters, and one or more amplifiers;

a transmitting RF channel having a second input and a second output of RF wireless signals transmitted; and wherein the radiofrequency module is configured to filter and to amplify the RF wireless signals received;

the wireless transmitting and receiving module further comprising a high-IF module, said high-IF module comprising:

a receiving high-IF channel having a first input of RF signals and a first output of high-IF signals; and a transmitting high-IF channel having a second input of high-IF signals and a second output of RF signals;

wherein the RF signals received are transposed to a high inteiniediate frequency that is chosen to be at least greater than substantially twice the highest frequency of the RF wireless signals received by the radiofrequency module; and the wireless transmitting and receiving module further comprising a low-IF module, said low-IF module comprising:

a receiving channel having a first input of high-IF signals and a first output of low-IF signals, wherein the high-IF signals are transposed to a low intermediate frequency; and a transmitting channel having a second input of low-IF signals and a second output of high-IF signals, wherein the radiofrequency module, the high-IF module and the low-IF module are electrically and mechanically insulated and placed on a shared circuit board;

wherein the high-IF module receives on the first input one or more RF signals in the 225-520 MHz frequency band, and one or more RF signals in the 30-88 MHz frequency band, said high-IF module comprising a transmit channel and a receive channel for the 225-520 MHz frequency band and a transmit channel and a receive channel for the 30-88 MHz frequency band, said high-IF module comprising a mixer, amplifiers, band-pass filters, a 70 MHz high-pass filter, amplifiers and a mixer, the receive channel of the wireless transmitting and receiving module further comprising:

a low-pass filter having an input connected to the first input of the receive channel, to produce a filtered signal, wherein the low-pass filter has a cut-off frequency that is substantially equal to 600 MHz;

a first mixer having a first bidirectional port connected to an output of the low-pass filter, a first oscillator port connected to a first local oscillator module, to produce at a second bidirectional port a mixing of signals on the first bidirectional port and the oscillator port;

a second mixer having a first bidirectional port connected to an output of the amplifier, and a second oscillator port connected to a second local oscillator, to produce at a second bidirectional port a mixing of signals on the first bidirectional port and the oscillator port;

a first series connection of a filter and an amplifier, the first series connection connected from the second bidirectional port of the first mixer to the first bidirectional port of the second mixer, wherein the second bidirectional port of the second mixer forms an output of the receive channel; and the transmit channel, comprising:

the second mixer, wherein the second bidirectional port forms an input the transmit channel;

the first mixer;

a second series connection of a filter and an amplifier, the second series connection connected from the first bidirectional port of the second mixer to the second bidirectional port of the first mixer, wherein the first bidirectional port of the first mixer forms an output of the transmit channel.

4. The wireless transmitting and receiving module as claimed in claim 3, wherein the first local oscillator module comprises:

a phase-locked loop having an input that forms an input to the first local oscillator module, the input configured to receive a signal from a clock module, the signal having a frequency that is substantially stable and substantially equal to 160 MHz;

a voltage-controlled oscillator to produce a signal with a frequency ranging between 1250 and 1820 MHz, and having an output forming an output of the first local oscillator module;

a low-pass filter in a path between the phase-locked loop and the voltage-controlled crystal oscillator;

wherein the output of the first local oscillator module is transmitted to the first oscillator port of the high-IF module.

5. The wireless transmitting and receiving module as claimed in claim 3, wherein the second local oscillator module comprises:

a phase-locked loop having an input that forms an input to the second local oscillator module, the input configured to receive a signal from a clock module, the signal having a frequency that is substantially stable and substantially equal to 160 MHz;

a voltage-controlled oscillator to produce a signal with a frequency ranging between 1150 and 1290 MHz, and having an output forming an output of the second local oscillator module;

a low-pass filter in a path between the phase-locked loop and the voltage-controlled crystal oscillator;

wherein the output of the second local oscillator module is transmitted to the second oscillator port of the high-IF module.

6. The wireless transmitting and receiving module as claimed in claim 5, wherein the frequency of the signal transmitted on the output is chosen to be lower than or higher than the high intermediate frequency, the speed of frequency change being carried out by at least one of at the speed of the frequency hops of the signal transmitted and received by the wireless transmitting and receiving module.

7. The wireless transmitting and receiving module as claimed in claim 3, wherein all inactive elements of the wireless transmitting and receiving module are capable of being selectively switched off.

8. A wireless transmitting and receiving module, comprising:

a radiofrequency module comprising:

a receiving RF channel having a first input, a first output of RF wireless signals received, one or more filters, and one or more amplifiers;

a transmitting RF channel having a second input and a second output of RF wireless signals transmitted; and wherein the radiofrequency module is configured to filter and to amplify the RF wireless signals received;

the wireless transmitting and receiving module further comprising a high-IF module, said high-IF module comprising:

a receiving high-IF channel having a first input of RF signals and a first output of high-IF signals; and a transmitting high-IF channel having a second input of high-IF signals and a second output of RF signals;

wherein the RF signals received are transposed to a high intermediate frequency that is chosen to be at least greater than substantially twice the highest frequency of the RF wireless signals received by the radiofrequency module; and the wireless transmitting and receiving module further comprising a low-IF module, said low-IF module comprising:

a receiving channel having a first input of high-IF signals and a first output of low-IF signals, wherein the high-IF signals are transposed to a low intermediate frequency; and a transmitting channel having a second input of low-IF signals and a second output of high-IF signals, wherein the radiofrequency module, the high-IF module and the low-IF module are electrically and mechanically insulated and placed on a shared circuit board;

wherein the low-IF module receives on the first input one or more high-IF signals in the high intermediate frequency band, and one or more high-IF signals in the 30-88 MHz frequency band, said low-IF module comprising a low-pass filter the cut-off frequency of which is substantially equal to 70 MHz, a plurality of amplifiers, an array of tracking filters comprising band-pass filters, an anti-aliasing filter, one or more variable attenuators, a limiter and a switch, wherein:

for the receive channel, the signal received on the first input is sent to the low-pass filter, amplified, attenuated, filtered by the array of tracking filters, then amplified, attenuated, amplified, filtered by the anti-aliasing filter and limited, the signal received on the first input being routed to the second output; and for the transmit channel, the signal received on the second input is sent to the low-pass filter, amplified, attenuated, and filtered by the array of tracking filters, then amplified, the signal being routed to the switch which blocks or redirects the signal to the low-pass filter, the signal received on the second input being routed to the first output.

9. The wireless transmitting and receiving module as claimed in claim 8, wherein all inactive elements of the wireless transmitting and receiving module are capable of being selectively switched off.

* * * * *